(12) United States Patent
Zhou et al.

(10) Patent No.: US 8,389,367 B2
(45) Date of Patent: Mar. 5, 2013

(54) METHOD FOR MANUFACTURING A SEMICONDUCTOR DEVICE

(75) Inventors: Huajie Zhou, Beijing (CN); Qiuxia Xu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/257,413

(22) PCT Filed: Apr. 8, 2011

(86) PCT No.: PCT/CN2011/072527
§ 371 (c)(1),
(2), (4) Date: Sep. 19, 2011

(87) PCT Pub. No.: WO2012/113170
PCT Pub. Date: Aug. 30, 2012

(65) Prior Publication Data
US 2012/0220093 A1 Aug. 30, 2012

(30) Foreign Application Priority Data
Feb. 25, 2011 (CN) .......................... 2011 1 0046790

(51) Int. Cl.
*H01L 21/336* (2006.01)
(52) U.S. Cl. .................. 438/283; 257/E21.442
(58) Field of Classification Search .................. 438/284, 438/407; 257/E21.442
See application file for complete search history.

(56) References Cited

U.S. PATENT DOCUMENTS

| 6,858,478 B2 * | 2/2005 | Chau et al. ..................... 438/149 |
| 7,352,034 B2 * | 4/2008 | Booth et al. ................... 257/369 |
| 7,449,373 B2 | 11/2008 | Doyle et al. ................... 438/149 |

FOREIGN PATENT DOCUMENTS

| CN | 100392859 C | 6/2008 |
| CN | 101577278 B | 11/2010 |
| WO | WO 2008/026859 A1 | 3/2008 |

OTHER PUBLICATIONS

International Search Report (no English translation) for PCT Application No. PCT/CN2011/072527, dated Nov. 24, 2011, 4 pgs.
Written Opinion from International Search Report (no English translation) for PCT Application No. PCT/CN2011/072527, dated Nov. 24, 2011, 4 pgs.

* cited by examiner

*Primary Examiner* — Chandra Chaudhari
(74) *Attorney, Agent, or Firm* — Westman, Champlin & Kelly, P.A.

(57) ABSTRACT

The present application discloses a method for manufacturing a semiconductor device, comprising: forming a local buried isolation dielectric layer in a semiconductor substrate; forming a fin in the semiconductor substrate and on top of the local buried isolation dielectric layer; forming a gate stack structure on a top surface and side surfaces of the fin; forming source/drain structures in portions of the fin which are on opposite sides of the gate stack structure; and performing metallization. A conventional quasi-planar top-down process is utilized in the present invention to achieve a good compatibility with the CMOS planar processes, easy integration, and suppression of short channel effects, which promotes the development of MOSFETs having reduced sizes.

9 Claims, 3 Drawing Sheets

METHOD FOR MANUFACTURING A SEMICONDUCTOR DEVICE

CROSS-REFERENCE TO RELATED APPLICATION

This application is a National Phase application of, and claims priority to, No. PCT/CN2011/072527, filed on Apr. 8, 2011, entitled "METHOD FOR MANUFACTURING A SEMICONDUCTOR DEVICE", which claims priority to the Chinese Patent Application No. 201110046790.3, filed on Feb. 25, 2011. Both the PCT Application and Chinese Application are incorporated herein by reference in their entireties.

FIELD OF THE INVENTION

The present invention relates to semiconductor technology, and in particular, to a method for manufacturing a bulk silicon fin field effect transistor (FinFET).

BACKGROUND OF THE INVENTION

With the integrated circuit industry are kept developing according to the Moore Law, feature sizes of CMOS devices are kept shrinking. Planar bulk silicon CMOS structure devices have encountered serious challenges. To solve these issues, various novel device structures have been developed. Among a number of novel device structures, a fin field effect transistor (FinFET) is one of the most promising novel device structures that will take the place of planar bulk silicon CMOS devices. The FinFET has become an international research focus.

In early days, a FinFET structure device is manufactured on an SOI substrate, and the process for manufacturing such a device is relatively simple as compared with that for manufacturing such a device on a bulk silicon substrate. However, there are several drawbacks for an SOI FinFET, such as high manufacturing cost, poor heat dissipation, floating body effects, poor compatibility with the CMOS processes, etc. To solve these issues in connection with the SOI FinFET, researchers begin to study how to manufacture a FinFET device with a bulk silicon substrate, referred to as Bulk Silicon FinFET. The Bulk Silicon FinFET can be applied in the products such as DRAM, SRAM, etc. However, the conventional Bulk Silicon FinFET devices have several drawbacks as compared with the SOI FinFET devices, for example: short channel effects (SCEs) cannot be suppressed as required; a leakage path may still be formed with the portion of a fin at the bottom of a channel, which results in a large leakage; and the impurity profile cannot be well controlled.

To overcome above-mentioned problems and to promote the application of the FinFET structure devices, further researches in this field shall be carried out, which are very important for the application of the FinFET structure devices and the development of the semiconductor industry.

SUMMARY OF THE INVENTION

One object of the present invention is to provide a novel method for manufacturing a bulk silicon fin field effect transistor (FinFET). The method is easily incorporated with and highly compatible with the planar CMOS processes.

To achieve the above object of the present invention, the method according to the present invention mainly comprises: forming a local buried isolation dielectric layer in a semiconductor substrate; forming a fin in the semiconductor substrate on top of the local buried isolation dielectric layer; forming a gate stack structure on the top surface and side surfaces of the fin; forming source/drain structures in the fin on both sides of the gate stack structure; and performing metallization.

Preferably, the step of forming a local buried isolation dielectric layer in a semiconductor substrate may comprise: forming a dielectric layer on the semiconductor substrate; forming a trench on the semiconductor substrate by etching the dielectric layer; and implanting oxygen ions into the semiconductor substrate by means of high energy ion implantation, and performing high temperature annealing on the semiconductor substrate to form the local buried isolation dielectric layer.

Preferably, the dielectric layer may comprise one of $SiO_2$, TEOS and $Si_3N_4$, and may have a thickness of about 200-1000 nm.

Preferably, in the step of implanting oxygen ions into the semiconductor substrate by means of high energy ion implantation and performing high temperature annealing on the semiconductor substrate to form the local buried isolation dielectric layer, the local buried isolation dielectric layer may have a thickness of about 50-200 nm.

Preferably, the step of forming a fin in the semiconductor substrate on top of the local buried isolation dielectric layer may comprise: etching a portion of the semiconductor substrate on top of the local buried isolation dielectric layer to expose the local buried isolation dielectric layer, such that the semiconductor substrate is recessed to form at least two trenches, between which the fin is formed. The portion of the semiconductor substrate on top of the local buried isolation dielectric layer may have a thickness of about 20-100 nm, and the fin may have a thickness of about 10-60 nm.

Preferably, the step of forming a gate stack structure on the top surface and side surfaces of the fin may comprise: forming gate dielectric layer material and gate electrode material on the top surface and the side surfaces of the fin; and forming the gate stack structure by lithography and etching.

In a preferred embodiment of the present invention, prior to forming source/drain structures in the fin on both sides of the gate stack structure, the method may further comprise: performing angled ion implantation to form source/drain extensions in the fin; or performing angled ion implantation to form halo implantation regions.

Preferably, the step of forming source/drain structures in the fin on both sides of the gate stack structure may comprise: forming spacers on both sides of the fin; performing ion implantation to form source/drain doping regions; and forming source/drain silicides.

In a preferred embodiment of the present invention, the semiconductor substrate may be a bulk silicon substrate.

According to the above-mentioned technical solutions, the present invention has the following beneficial effects.

Firstly, the method for manufacturing a semiconductor device according to the present invention can provide a fin field effect transistor on a bulk silicon substrate. The method overcomes self-heating effects and floating body effects in connection with an SOI FinFET device, and it thus reduces the manufacturing cost.

Secondly, the method for manufacturing a semiconductor device according to the present invention overcomes the drawbacks in conventional Bulk Silicon FinFET devices, such as a large leakage, poor suppression of SCE effects, and an impurity profile that is difficult to control, etc.

Thirdly, the method for manufacturing a semiconductor device according to the present invention can be easily implemented with a simple manufacture process, and is easy to be incorporated with and highly compatible with the planar CMOS processes.

BRIEF DESCRIPTION OF THE DRAWINGS

The above and other objects, features and advantages of the present invention will become clearer from the following description for embodiments of the present invention, with reference to the attached drawings, in which.

Figure 1:
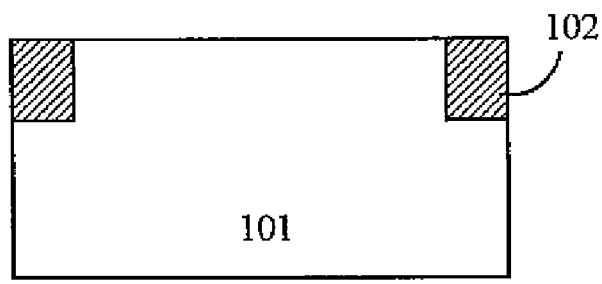
FIGS. 1-7 are cross-sectional views showing corresponding structures in a flow of the method for manufacturing a fin field effect transistor according to an embodiment of the present invention, respectively.

REFERENCE NUMERALS 101 silicon substrate
102 shallow trench isolation (STI)
103 dielectric layer
104 trench structure
105 implanted oxygen ions
106 local buried isolation dielectric layer
107 fin
108 gate dielectric layer
109 gate electrode It should be noted that the attached drawings of the present invention are not drawn to scale, but only for the purpose of illustration. Therefore, the attached drawings should not be construed as any limitation or restriction to the scope of the present invention. In the attached drawings, like components are denoted by like reference numerals.

DETAILED DESCRIPTION OF PREFERRED EMBODIMENTS

Hereinafter, the present invention will be described in accordance with a preferred embodiment shown in the attached drawings. However, it should be understood that the description is made for illustration only, rather than limitation to the scope of the present invention. Furthermore, in the following detailed description, the description of well-known structures and technologies are omitted to avoid obscuration of the present invention.

Schematic diagrams of the layer structure according to an embodiment of the present invention are shown in the attached drawings. These diagrams are not drawn to scale, but some details are exaggerated and other details are omitted for clarity. Shapes, relative sizes and position relationships of various areas and layers are only illustrative. Deviations may be introduced by manufacture tolerance or technical limitations in practice. Furthermore, areas/layers with different shapes, sizes, or relative positions may be designed by one skilled in the art as desired.

FIGS. 1-7 are cross-sectional views of the structures corresponding to steps of the method for manufacturing a semiconductor device according to an embodiment of the present invention. Hereinafter, each step according to the embodiment of the present invention will be described in detail with reference to those drawings.

First, referring to FIG. 1, a shallow trench isolation (STI) 102 is formed in a semiconductor substrate 101. Specifically, the semiconductor substrate 101 may be made of any conventional substrate materials used in the semiconductor manufacture field. In one embodiment of the present invention, a bulk silicon substrate is preferred.

Figure 2:
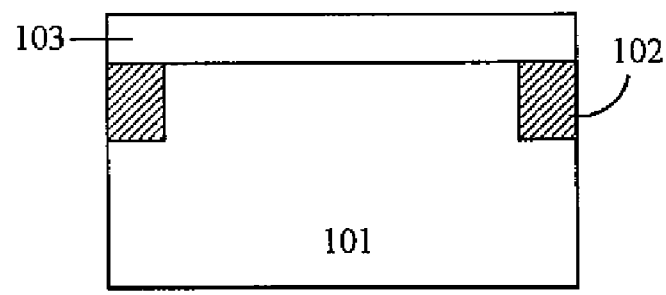

Next, as shown in FIG. 2, a dielectric layer 103 is formed on the semiconductor substrate 101. The dielectric layer 103 may comprises one of $SiO_2$, TEOS, $Si_3N_4$ and any other dielectric materials. In one embodiment of the present invention, $SiO_2$ is preferred. The dielectric layer 103 may be formed by thermal growth, and may have a thickness of about 200-1000 nm. This dielectric layer 103 serves as a mask layer during the subsequent steps of ion implantation and fin etching.

Figure 3A:
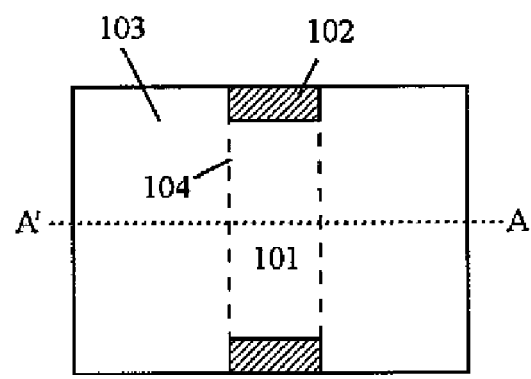
Figure 3B:
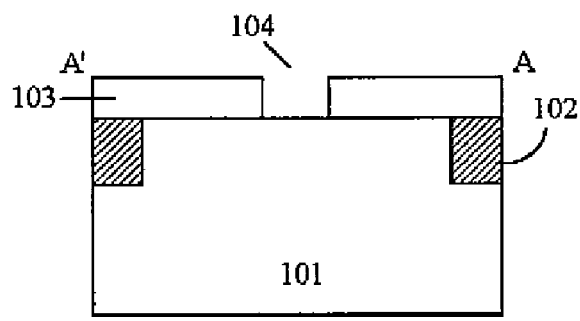

FIG. 3A shows a schematic diagram as viewed from the top surface of the semiconductor substrate 101, and FIG. 3B is a cross-sectional view taken in a direction indicated by AA' in FIG. 3A. As shown in FIGS. 3A and 3B, the dielectric layer 103 is etched to form a trench 104. A method for forming the trench 104 by etching may be, for example, exposing a positive photoresist to an electron beam, and then performing reactive ion etching to form a steep trench 104 with a width of about 200-400 nm. The shape of the trench is given only as an example, rather than limitation, in the present invention. The region of the trench is the region where a local buried isolation dielectric layer 106 is to be formed later.

Figure 4:
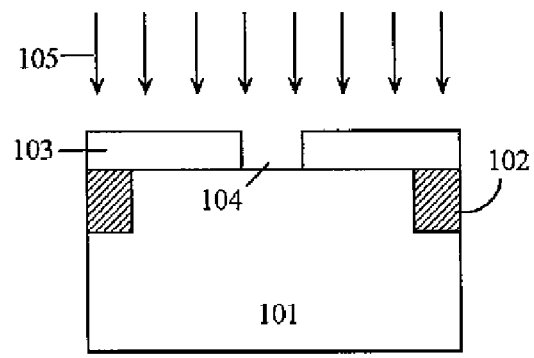

FIG. 4 is a schematic diagram for illustrating the step of implanting oxygen ions 105 into the semiconductor substrate 101 by means of high energy ion implantation. As shown in FIG. 4, during the ion implantation, the oxygen ions 105 are implanted into one portion of the semiconductor substrate 101 below the area of the trench 104, but not implanted into the other portions of the semiconductor substrate 101 that are masked by the dielectric layer 103. The process for implanting oxygen ions by means of high energy ions may use conventional techniques in the art, the detailed description of which is omitted for simplicity.

Figure 5:
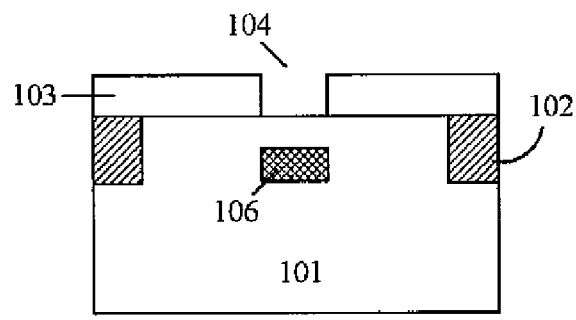

Next, referring to FIG. 5, a local buried isolation dielectric layer is formed in the semiconductor substrate 101 below the area of the trench 104. Specifically, after the oxygen ions are implanted by means of high energy ions, the implanted oxygen ions react with silicon in a high temperature process, such that the local buried isolation dielectric layer 106 is formed. The local buried isolation dielectric layer 106 may have a thickness of about 50-200 nm for an improved isolation effect.

Figure 6A:
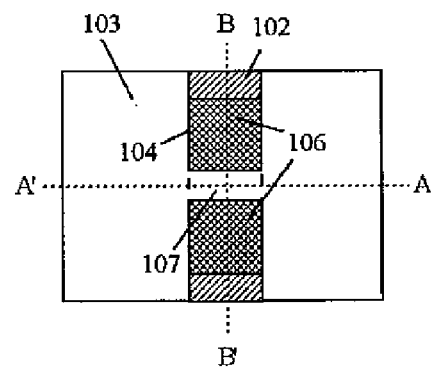
Figure 6B:
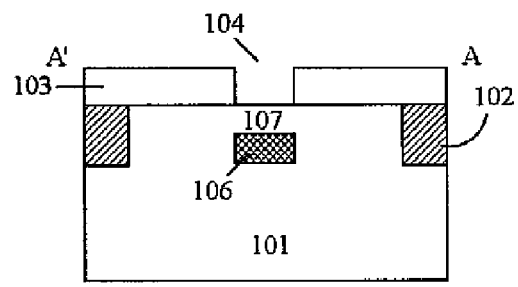
Figure 6C:
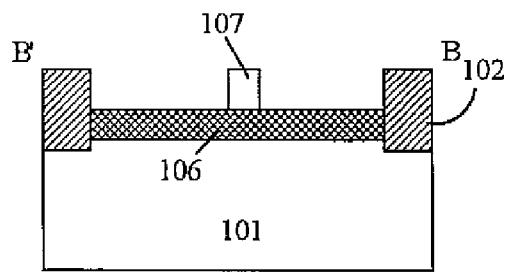

Next, referring to FIGS. 6A, 6B, and 6C, a fin 107 is formed in the semiconductor substrate 101 on top of the local buried isolation dielectric layer 106. FIG. 6A shows a schematic diagram as viewed from the top surface of the semiconductor substrate 101, and FIGS. 6B and 6C are cross-sectional views taken in the directions indicated by AA' and BB' in FIG. 6A, respectively. Specifically, a negative photoresist is exposed to an electron beam and the silicon substrate 101 is etched by reactive ion etching to form the fin 107. The fin 107 has a thickness of about 10-60 nm and a height of about 20-100 nm. The dielectric layer 103 is removed after the fin 107 is formed.

Figure 7A:
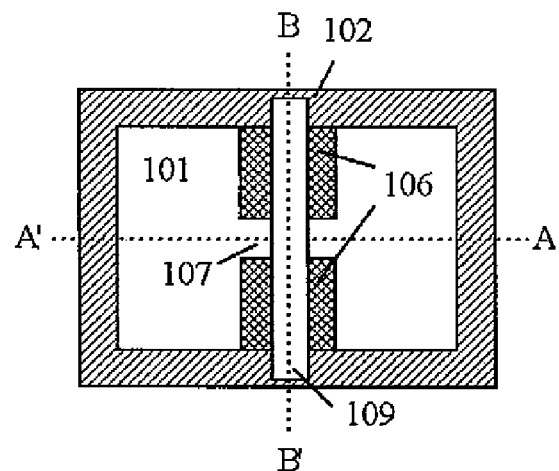
Figure 7B:
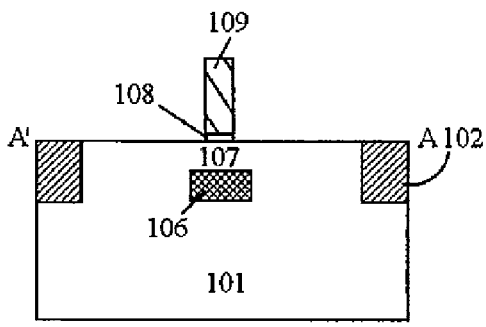
Figure 7C:
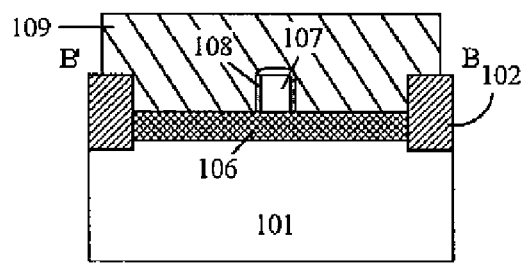

Next, as shown in FIGS. 7A, 7B, and 7C, a gate dielectric layer material 108 and a gate electrode material 109 are formed on the whole substrate, and then etched to form a gate stack structure. FIG. 7A shows a schematic diagram as viewed from the top surface of the semiconductor substrate 101, and FIGS. 7B and 7C are cross-sectional views taken in the directions indicated by AA' and BB' in FIG. 7A, respectively. The gate dielectric layer material 108 may be a conventional material for a gate dielectric layer, such as $SiO_2$, or any other high dielectric constant (high-K) dielectric materials, such as SiON, HfAlON, HfTaON, HfSiON, $Al_2O_3$, etc. In one embodiment of the present invention, HfSiON is preferred. The gate dielectric layer material may be formed by low pressure chemical vapor deposition (LPCVD), metal organic chemical vapor deposition (MOCVD), or atomic layer deposition (ALD), etc. An equivalent oxide thickness of the gate dielectric layer material is about 5 to 100 Å. The gate electrode material 109 may be a refractory metal, such as W, Ti, Ta, or Mo, or a metal nitride, such as TiN, TaN, HfN, or MoN, or any other materials. The gate electrode material may be formed by low pressure chemical vapor deposition (LPCVD), metal organic chemical vapor deposition (MOCVD), atomic layer deposition (ALD), or any other suitable processes. A thickness of the gate electrode material may be Chosen in a range from about 2000 to about 5000 Å.

Optionally, after the gate stack structure is formed, the method may further comprise: performing an angled ion implantation to form source/drain extensions in the fin; or performing an angled ion implantation to form halo implantation regions.

Next, sidewall spacers are formed on both sides of the gate stack. The process for forming the sidewall spacer may use conventional techniques in the art, the detailed description of which is omitted for simplicity.

Next, ions are implanted into the semiconductor substrate on both sides of the gate stack, to form source/drain regions and source/drain silicides.

Finally, an interconnection structure is formed by metallization to provide connections with electrodes. The process for forming metallization may use conventional techniques in the art, the detailed description of which is omitted for simplicity.

The method for manufacturing a semiconductor device according to the present invention can provide a fin field effect transistor on a bulk silicon substrate. This method utilizes a conventional quasi-planar top-down process, can be easily implemented with a simple manufacture process, and is easy to be incorporated with and highly compatible with the planar CMOS processes.

In the above description, technical details of patterning and etching in various layers are not described in detail. However, it should be understood by one skilled in the art that a layer or area with a desired shape can be formed by various technical approaches known in the prior art. Furthermore, one skilled in the art may design processes different from, or at least partially different from, the above-mentioned processes to form the same structure.

Although the invention has been described with reference to specific embodiments, the description is only illustrative of the invention. The description shall not be construed as limiting the invention. The protection scope is defined by the appended claims and their equivalents. Various modifications and applications can be made by those skilled in the art without departing from the spirit and scope of the invention as defined by the appended claims.

What is claimed is:

1. A method for manufacturing a semiconductor device, comprising:
    forming a local buried isolation dielectric layer in a semiconductor substrate;
    forming a fin in the semiconductor substrate and on top of the local buried isolation dielectric layer by etching a portion of the semiconductor substrate on top of the local buried isolation dielectric layer to expose the local buried isolation dielectric layer, such that the semiconductor substrate is recessed to form at least two trenches, and the fin is formed between the at least two trenches;
    forming a gate stack structure on a top surface and side surfaces of the fin;
    forming source/drain structures in portions of the fin which are on opposite sides of the gate stack structure; and
    performing metallization.

2. The method according to claim 1, wherein the step of forming the local buried isolation dielectric layer in the semiconductor substrate comprises:
    forming a dielectric layer on the semiconductor substrate;
    forming a trench on the semiconductor substrate by etching the dielectric layer; and
    implanting oxygen ions into the semiconductor substrate by means of high energy ion implantation, and performing high temperature annealing on the semiconductor substrate, such that the local buried isolation dielectric layer is formed.

3. The method according to claim 2, wherein the dielectric layer comprises one of $SiO_2$, TEOS, and $Si_3N_4$, and has a thickness of about 200-1000 nm.

4. The method according to claim 2, wherein, in the step of implanting oxygen ions into the semiconductor substrate by means of the high energy ion implantation and performing the high temperature annealing on the semiconductor substrate to form the local buried isolation dielectric layer, the local buried isolation dielectric layer has a thickness of about 50-200 nm.

5. The method according to claim 1, wherein the portion of the semiconductor substrate on top of the local buried isolation dielectric layer has a thickness of about 20-100 nm, and the fin has a thickness of about 10-60 nm.

6. The method according to claim 1, wherein the step of forming the gate stack structure on the top surface and side surfaces of the fin comprises:
    forming gate dielectric layer material and gate electrode material on the top surface and the side surfaces of the fin; and
    forming the gate stack structure by lithography and etching.

7. The method according to claim 1, wherein, prior to forming the source/drain structures in the fin on the opposite sides of the gate stack structure, the method further comprises:
    performing angled ion implantation to form source/drain extensions in the fin; or
    performing angled ion implantation to form halo implantation regions.

8. The method according to claim 1, wherein the step of forming the source/drain structures in the fin on the opposite sides of the gate stack structure comprises:
    forming spacers on both sides of the fin;
    performing ion implantation to form source/drain doping regions; and
    forming source/drain silicides.

9. The method according to claim 1, wherein the semiconductor substrate is a bulk silicon substrate.

* * * * *